United States Patent
Agarwal et al.

(10) Patent No.: US 11,543,460 B2
(45) Date of Patent: Jan. 3, 2023

(54) BATTERY STATE MEASURING METHOD AND BATTERY MANAGEMENT SYSTEM

(71) Applicant: SAMSUNG ELECTRONICS CO., LTD., Suwon-si (KR)

(72) Inventors: Samarth Agarwal, Bangalore (IN); Subramanian Swernath Brahmadathan, Bangalore (IN); Krishnan S Hariharan, Bangalore (IN); Seongho Han, Suwon-si (KR); Anshul Kaushik, Bangalore (IN); Rajkumar Subhash Patil, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 17/018,329

(22) Filed: Sep. 11, 2020

(65) Prior Publication Data

US 2021/0080509 A1 Mar. 18, 2021

(30) Foreign Application Priority Data

Sep. 12, 2019 (IN) .............................. 201941036743
Sep. 3, 2020 (IN) .............................. 201941036743

(51) Int. Cl.
*G01R 31/392* (2019.01)
*G01R 31/36* (2020.01)
(Continued)

(52) U.S. Cl.
CPC .......... *G01R 31/392* (2019.01); *B60L 3/0046* (2013.01); *B60L 58/16* (2019.02); *G01R 31/3648* (2013.01); *G01R 31/371* (2019.01)

(58) Field of Classification Search
CPC .... B60L 2240/549; B60L 3/0046; B60L 3/12; B60L 58/16; G01R 31/3648;
(Continued)

(56) References Cited

U.S. PATENT DOCUMENTS 5,808,445 A * 9/1998 Aylor .................. H02J 7/00047
320/132
6,300,763 B1 * 10/2001 Kwok ................... H01M 10/44
320/132
(Continued)

FOREIGN PATENT DOCUMENTS

EP 3 913 385 A1 11/2021
JP 20118593 A 1/2011
(Continued)

OTHER PUBLICATIONS

International Search Report and Written Opinion dated Dec. 16, 2020 by the International Searching Authority in International Application No. PCT/KR202/012304.

*Primary Examiner* — Vinh P Nguyen
(74) *Attorney, Agent, or Firm* — Sughrue Mion, PLLC

(57) ABSTRACT

Provided are a battery state measuring method and battery management system, which predict a time point when charging capacity of a battery is to be relatively abruptly reduced. The battery state measuring method includes: monitoring a change of at least one precursor related to the charging capacity of the battery with respect to a number of charging cycles undergone by the battery; and predicting that an abrupt reduction in the charging capacity of the battery is imminent when the change of the at least one precursor follows at least one pre-configured pattern of the battery that has undergone a critical number of charging cycles.

9 Claims, 7 Drawing Sheets

(51) Int. Cl.
    *B60L 3/00*           (2019.01)
    *B60L 58/16*         (2019.01)
    *G01R 31/371*      (2019.01)

(58) Field of Classification Search
    CPC .. G01R 31/367; G01R 31/371; G01R 31/392; Y02T 10/70; Y02E 60/10
    See application file for complete search history.

(56) References Cited

U.S. PATENT DOCUMENTS

| | | | | |
|---|---|---|---|---|
| 7,507,497 | B2 * | 3/2009 | Yamashita | G01R 31/392 |
| | | | | 429/61 |
| 8,483,983 | B2 * | 7/2013 | Shin | G01R 31/392 |
| | | | | 702/63 |
| 9,869,713 | B2 * | 1/2018 | Lim | H01L 22/34 |
| 9,915,705 | B2 * | 3/2018 | Tashima | G01R 31/392 |
| 10,312,699 | B2 * | 6/2019 | Subbaraman | G01R 31/367 |
| 10,557,890 | B2 * | 2/2020 | Li | G01R 31/367 |
| 10,598,735 | B2 | 3/2020 | Lee | |
| 11,061,076 | B1 * | 7/2021 | Fasching | G01R 31/385 |
| 2019/0113577 | A1 | 4/2019 | Severson et al. | |
| 2019/0346512 | A1 | 11/2019 | Iguchi et al. | |
| 2020/0203780 | A1 | 6/2020 | Mandli et al. | |

FOREIGN PATENT DOCUMENTS

| | | |
|---|---|---|
| JP | 6326745 B2 | 5/2018 |
| KR | 1020160017416 A | 2/2016 |
| KR | 101946163 B1 | 4/2019 |
| KR | 10-2020-0131629 A | 11/2020 |

* cited by examiner

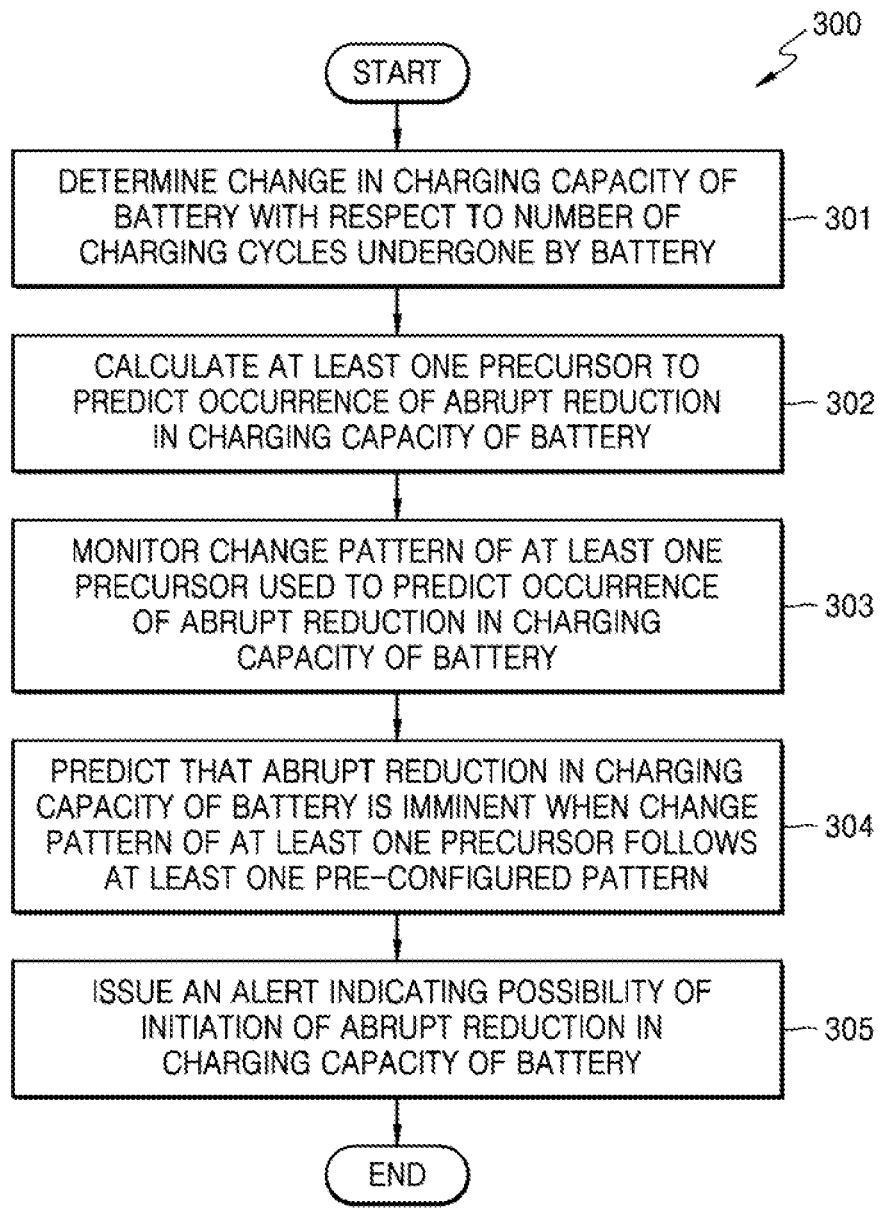

BATTERY STATE MEASURING METHOD AND BATTERY MANAGEMENT SYSTEM

CROSS-REFERENCE TO RELATED APPLICATION

This application is based on and claims priority under 35 U.S.C. § 119 to Indian Patent Application No. 201941036743, filed on Sep. 12, 2019, in the Intellectual Property India, and Indian Patent Application No. 201941036743, filed on Sep. 3, 2020, in the Intellectual Property India, the disclosures of which are incorporated herein by reference in its entirety.

BACKGROUND

1. Field

The disclosure relates to a battery state measuring method and a battery management system, and more particularly, to a battery state measuring method and battery management system, in which an abrupt reduction in charging capacity of a battery may be predicted by monitoring a change pattern of at least one precursor with respect to the charging capacity of the battery.

2. Description of Related Art

Currently, increasing numbers of electronic devices and electric vehicles rely on a rechargeable battery as a power source. The rechargeable battery is applied to many electronic devices and electric vehicles and stability thereof may be very important. There is known a sudden death phenomenon, in which a battery suddenly stops operating due to an abrupt reduction in charging capacity of the rechargeable battery. The sudden death phenomenon may be a major cause Arts of deteriorating stability of the rechargeable battery.

With the increase in the use of the electronic devices and electric vehicles, the number of charging/discharging cycles of the rechargeable battery of the electronic devices and electric vehicles is also increasing. The charging capacity of the rechargeable battery is gradually reduced with each charging/discharging cycle. A rate of reduction in the charging capacity and current charging capacity of the rechargeable battery may be indicated by using a state of health (SoH).

However, when the charging capacity of the rechargeable battery is reduced below a certain level, the charging capacity of the rechargeable battery is expected to reduce abruptly. Accordingly, all rechargeable batteries may exhibit the sudden death phenomenon due to the abrupt reduction in the charging capacities, thereby hindering operations of the electronic devices and electric vehicles.

SoH and remaining useful life (RUL) prediction may be used as a method of detecting an abrupt reduction of charging capacity of a battery. When the SoH and RUL prediction is used, it is highly likely that the abrupt reduction of the charging capacity of the battery is detected only when it is close to a moment when a sudden death phenomenon of the battery is initiated. In this regard, a user may not be provided with sufficient time to initiate any corrective action, such as modifying a usage pattern or replacing the battery.

In order to detect the abrupt reduction in the charging capacity of the battery sufficiently before the moment when the sudden death phenomenon occurs, an elaborate analysis of the battery, extensive crunching, specialized measurement, and the like may be required. The elaborate analysis, crunching, and specialized measurement require extensive power and computational capabilities. Accordingly, it may not be pragmatic to detect the abrupt reduction of the charging capacity of the battery online (in an electronic device/electronic vehicle).

SUMMARY

Provided are a battery state measuring method and battery management system for predicting occurrence of an abrupt reduction in charging capacity of a battery provided in a device/vehicle sufficiently before a time point when the battery may become inoperable.

Provided are a battery state measuring method and battery management system for predicting an abrupt reduction in charging capacity of a battery and issuing at least one alert indicating that the abrupt reduction in charging capacity of the battery is imminent.

Provided are a battery state measuring method and battery management system for providing a sufficient time to a user to take a corrective action such that a sudden death phenomenon of a battery does not occur, by predicting occurrence of an abrupt reduction in charging capacity of the battery based on real-time monitoring of a change pattern of at least one precursor with respect to the charging capacity of the battery.

Additional aspects will be set forth in part in the description which follows and, in part, will be apparent from the description, or may be learned by practice of the presented embodiments of the disclosure.

According to an embodiment of the disclosure, a battery state measuring method for predicting a time point when charging capacity of a battery is to be relatively abruptly reduced is provided.

The battery state measuring method includes: monitoring a change pattern of at least one precursor related to the charging capacity of the battery with respect to a number of charging cycles undergone by the battery; and predicting that an abrupt reduction in the charging capacity of the battery is imminent when the change pattern of the at least one precursor follows at least one pre-configured pattern of the battery that has undergone a critical number of charging cycles.

The at least one precursor may include a first derivative and a second derivative of the charging capacity of the battery with respect to an additional number of charging cycles undergone by the battery after a reference number of charging cycles is undergone by the battery, and a useful life of the battery related to a number of charging cycles for maintaining the battery operable.

The predicting that the abrupt reduction in the charging capacity of the battery is imminent may include predicting that the abrupt reduction in the charging capacity of the battery is imminent when a change pattern of at least one of the first derivative or the second derivative of the charging capacity of the battery follows the at least one pre-configured pattern.

The at least one pre-configured pattern followed by the change pattern of at least one of the first derivative or the second derivative may include a pattern that decreases and then increases.

The predicting that the abrupt reduction in the charging capacity of the battery is imminent may include predicting that the abrupt reduction in the charging capacity of the battery is imminent when a change pattern of the useful life of the battery follows the at least one pre-configured pattern, The at least one pre-configured pattern followed by the change pattern of the useful life of the battery may include a pattern that increases and then decreases.

The battery state measuring method may further include issuing at least one alert indicating that the abrupt reduction in the charging capacity of the battery is imminent.

The issuing of the at least one alert may include at least one of displaying a warning message indicating that the battery is unreliable or suggesting at least one corrective action for delaying initiation of the abrupt reduction in the charging capacity of the battery.

According to another embodiment of the disclosure, a battery state measuring method includes: estimating the charging capacity of the battery by using real-time charging/discharging data of the battery; calculating a first derivative of the estimated charging capacity of the battery; calculating a second derivative of the estimated charging capacity of the battery; calculating a useful life of the estimated charging capacity of the battery; monitoring a change pattern of at least one value of the first derivative, the second derivative, and the useful life of the charging capacity of the battery; and generating a decision indicative of abrupt reduction in the charging capacity of the battery, based on the change pattern of the at least one value of the first derivative, the second derivative, and the useful life of the charging capacity of the battery.

According to another embodiment of the disclosure, a battery management system for predicting a time point when charging capacity of a battery is to be relatively abruptly reduced is provided.

The battery management system may include at least one battery and a processor configured to measure a state of the battery.

The processor is further configured to: monitor a change pattern of at least one precursor related to the charging capacity of the battery with respect to a number of charging cycles undergone by the battery; and predict that an abrupt reduction in the charging capacity of the battery is imminent when the change pattern of the at least one precursor follows at least one pre-configured pattern of the battery that has undergone a critical number of charging cycles.

The at least one precursor may include a first derivative and a second derivative of the charging capacity of the battery with respect to an additional number of charging cycles undergone by the battery after a reference number of charging cycles is undergone by the battery, and a useful life of the battery related to a number of charging cycles for maintaining the battery operable.

The processor may be further configured to predict that the abrupt reduction in the charging capacity of the battery is imminent when a change pattern of at least one of the first derivative or the second derivative of the charging capacity of the battery follows the at least one pre-configured pattern.

The at least one pre-configured pattern followed by the change pattern of at least one of the first derivative or the second derivative may include a pattern that decreases and then increases.

The processor may be further configured to predict that the abrupt reduction in the charging capacity of the battery is imminent when a change pattern of the useful life of the battery follows the at least one pre-configured pattern.

The at least one pre-configured pattern followed by the change pattern of the useful life of the battery may include a pattern that increases and then decreases.

The processor may be further configured to issue at least one alert indicating that the abrupt reduction in the charging capacity of the battery is imminent.

The battery management system may further include a display displaying a message according to the at least one alert issued by the processor.

The message may include at least one of a warning message indicating that the battery is unreliable or a message suggesting at least one corrective action for delaying initiation of the abrupt reduction in the charging capacity of the battery.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7 is a flowchart of a method of predicting an abrupt reduction in a charging capacity of a battery, according to various embodiments of the disclosure.

DETAILED DESCRIPTION

Figure 1:
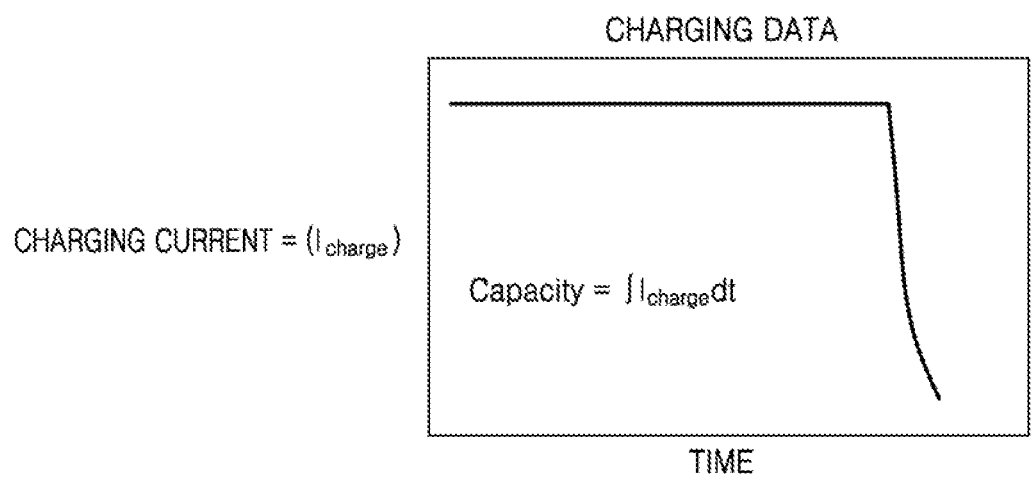
FIG. 1 is a schematic graph of an exemplary change pattern of a charge current delivered to a battery over time.

Hereinafter, a battery state measuring method and battery management system according to embodiments of the disclosure will be described in detail with reference to accompanying drawings to be easily implemented by one of ordinary skill in the art. In the drawings, like reference numerals denote like elements and the sizes or thicknesses the elements may be exaggerated for clarity of description. The battery state measuring method and battery management system according to various embodiments of the disclosure described below are only examples and thus may be implemented in various different forms and are not limited to the embodiments of the disclosure described herein.

When an element is described to be "on" or "above" another element, the element may contact and be directly on the other element or may be on the other element without contacting the other element. An expression used in the singular encompasses the expression in the plural, unless it has a clearly different meaning in the context. In addition, when a part "includes" a certain element, the part may further include another element instead of excluding the other element, unless otherwise stated.

The use of the term "the" and similar indicative terms may correspond to both the singular and the plural. The use of all examples or exemplary terms is merely for describing the technical ideas in detail, and the scope of the disclosure is not limited by the examples or exemplary terms unless limited by the claims.

Various embodiments of the disclosure may provide a battery state measuring method and battery management system, which predict a relatively abrupt reduction in charging capacity of a battery. The battery state measuring method and battery management system according to various embodiments of the disclosure may predict occurrence of an abrupt reduction in the charging capacity of the battery sufficiently before a time point when the battery may become inoperable. Also, the battery state measuring method and the battery management system according to various embodiments of the disclosure may calculate a value of at least one precursor used to predict the occurrence of the abrupt reduction in the charging capacity of the battery. The at least one precursor may include a first derivative and a second derivative with respect to a number of charging cycles of the charging capacity of the battery, and a useful life of the battery.

The battery state measuring method and battery management system according to various embodiments of the disclosure may perform real-time monitoring on the value of the at least one precursor. The value of at least one precursor may be calculated after every charging cycle or discharging cycle undergone by the battery.

The battery state measuring method and battery management system according to various embodiments of the disclosure may issue at least one alert indicating that the abrupt reduction in the charging capacity of the battery is imminent. For example, the alert may be issued when it is detected that a change pattern of the value of the at least one precursor follows at least one pre-configured pattern.

Figure 2:
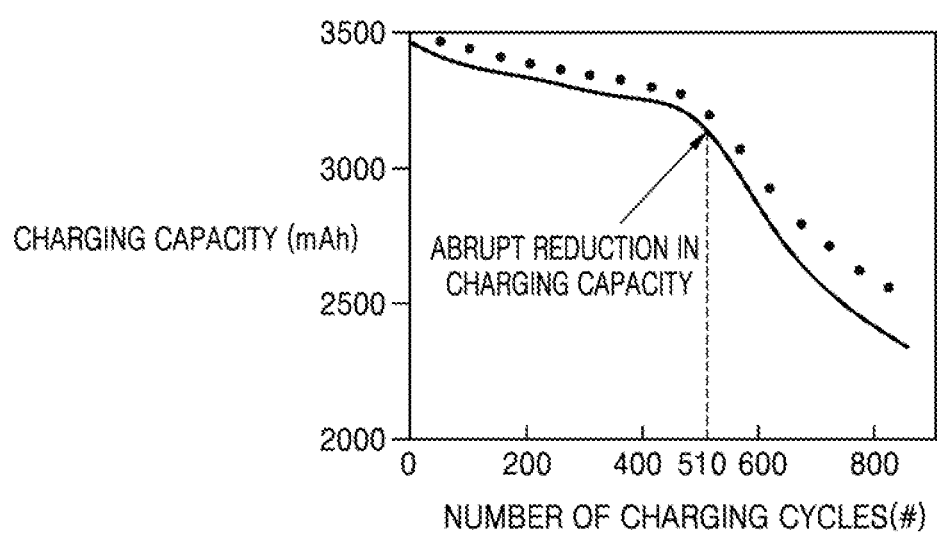
FIG. 2 is a schematic graph of an exemplary change pattern of charging capacity of a battery according to the number of charging cycles after an $i^{th}$ charging cycle undergone by the battery.
Figure 3:
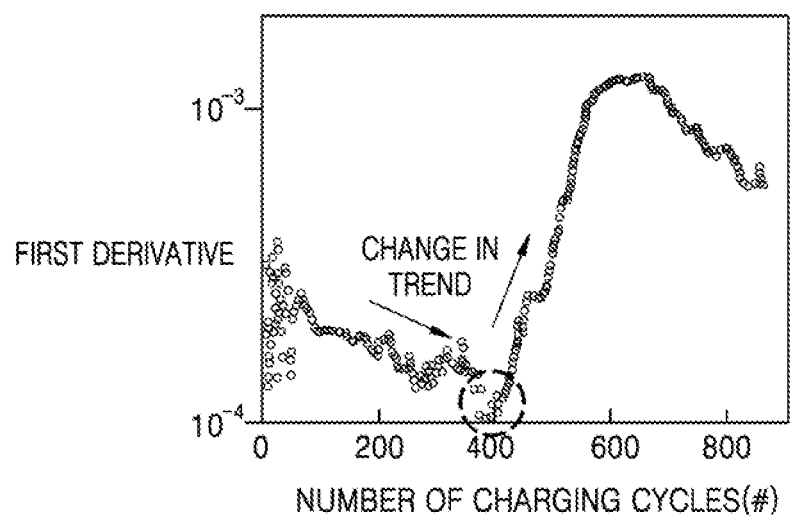
FIG. 3 is a schematic graph of an exemplary change pattern of an absolute value normalized to a charging capacity value of a battery of a first derivative of charging capacity of the battery with respect to the number of charging cycles after an $i^{th}$ charging cycle undergone by the battery.
Figure 4:
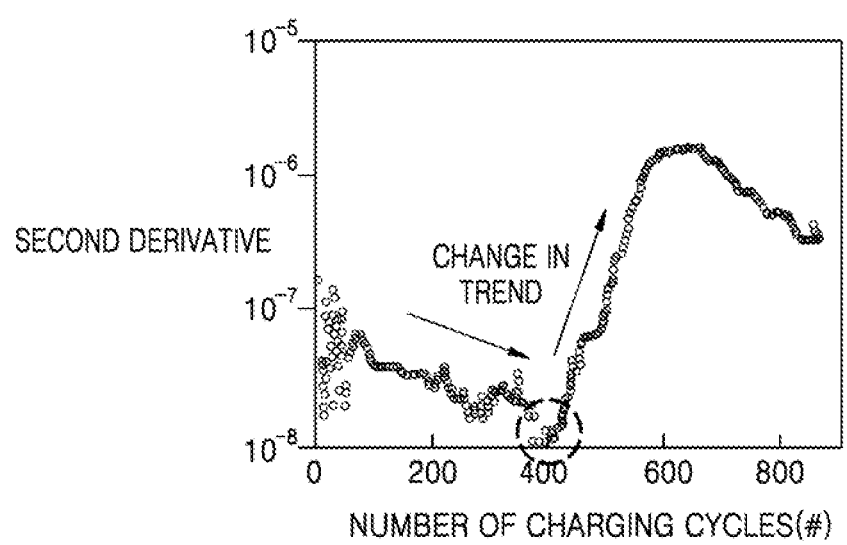
FIG. 4 is a schematic graph of an exemplary change pattern of a value normalized to a charging capacity value of a battery of a second derivative of charging capacity of the battery with respect to the number of charging cycles after an $i^{th}$ charging cycle undergone by the battery.
Figure 5:
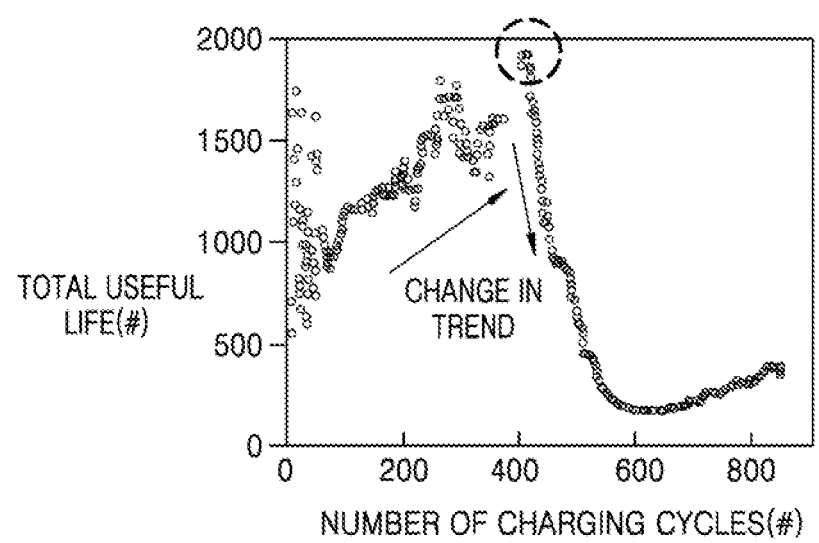
FIG. 5 is a schematic graph of an exemplary change pattern of a useful life of a battery with respect to the number of charging cycles undergone by the battery.

FIG. 1 is a schematic graph of an exemplary change pattern of a charge current $I_{charge}$ delivered to a battery over time. FIG. 2 is a schematic graph of an exemplary change pattern of charging capacity of a battery according to number of charging cycles after an $i^{th}$ charging cycle undergone by the battery. FIG. 3 is a schematic graph of an exemplary change pattern of an absolute value normalized to a charging capacity value of a battery of a first derivative of charging capacity of the battery with respect to the number of charging cycles after an $i^{th}$ charging cycle undergone by the battery. FIG. 4 is a schematic graph of an exemplary change pattern of a value normalized to a charging capacity value of a battery of a second derivative of charging capacity of the battery with respect to the number of charging cycles after an $i^{th}$ charging cycle undergone by the battery; FIG. 5 is a schematic graph of an exemplary change pattern of a useful life of a battery with respect to the number of charging cycles undergone by the battery.

Referring to FIG. 1, the charge current $I_{charge}$ delivered to the battery to charge the battery may be reduced as the battery is charged. This may be because the charge current $I_{charge}$ when the charging of the battery is initiated is sufficiently high. As a battery charging rate increases, charging capacity of the battery and a voltage across terminals of the battery may increase. Thus, the charge current $I_{charge}$ may be reduced as the battery charging rate increases. A relationship between the charge current $I_{charge}$ and the charging capacity of the battery may be defined as Equation 1 below.

$$\text{Capacity} = \int I_{charge} dt \quad \text{(Equation 1)}$$

Referring to FIG. 2, initial charging capacity of the battery may be close to 3500 mAh. As the number of charging cycles increases with the use of the battery, the charging capacity of the battery may start to be reduced. The charging capacity of the battery may be gradually reduced as the battery undergoes a greater number of charging cycles. The charging capacity of the battery immediately after an $i^{th}$ charging cycle may be defined as $C_i$. The charging capacity of the battery immediately after an $i+N^{th}$ charging cycle may be defined as Equation 2 below based on the $i^{th}$ charging cycle.

$$C_{i+N} = C_i \exp(-\beta N) \quad \text{(Equation 2)}$$

In Equation 2, $\beta$ denotes a fitting parameter defining a rate of reduction in the charging capacity of the battery. The fitting parameter $\beta$ may decrease as the rate of reduction in the charging capacity of the battery is gradually reduced. On the other hand, the fitting parameter $\beta$ may increase as the rate of reduction in the charging capacity of the battery is abruptly reduced. According to Equation 2, the reduction in the charging capacity of the battery with respect to the number of charging cycles follows a pattern of a decaying exponential function.

One of precursors used to predict the abrupt reduction in the charging capacity of the battery may include a first derivative of the charging capacity of the battery with respect to the number of charging cycles undergone by the battery. The first derivative of the charging capacity of the battery with respect to the number of charging cycles after the $i+N^{th}$ charging cycle is defined as Equation 3 below.

$$\frac{dC_{i+N}}{dN} = -C_i \beta \exp(-\beta N) \quad \text{(Equation 3)}$$

As shown in FIG. 3, a value of the first derivative with respect to the number of charging cycles of the charging capacity of the battery may be calculated based on $$\left| \frac{1}{C_i} \frac{dC_{i+N}}{dN} \right|.$$

Accordingly, an absolute value of a value normalized to a charging capacity value of the battery of the value of the first derivative with respect to the number of charging cycles of the charging capacity of the battery is defined as Equation 4.

$$\left| \frac{1}{C_i} \frac{dC_{i+N}}{dN} \right| = \beta \exp(-\beta N) \quad \text{(Equation 4)}$$

The second derivative of the charging capacity of the battery with respect to the number of charging cycles after the $i+N^{th}$ charging cycle is defined as Equation 5 below.

$$\frac{d^2 C_{i+N}}{dN^2} = C_i \beta^2 \exp(-\beta N) \quad \text{(Equation 5)}$$

As shown in FIG. 4, a value normalized to a charging capacity value of the battery of a value of the second derivative with respect to the number of charging cycles of the charging capacity of the battery may be calculated based on Equation 6.

$$\frac{1}{C_i}\frac{d^2 C_{i+N}}{dN^2} = \beta^2 \exp(-\beta N)$$ (Equation 6)

The change pattern of the useful life of the battery shown in FIG. 5 is a change pattern of a total usage life of the battery, i.e., a time period during which the battery is continuously usable (operable). A change in a total usage time of the battery may be determined based on Equation 7 below.
When $$C_{i+N} = 0.8 C_i, N = -\frac{\log(0.8)}{\beta}$$ (Equation 7)

Equation 7 indicates that the battery is usable unless the charging capacity of the battery after N charging cycles is not reduced to 80% of the initial charging capacity.

The reduction in the charging capacity of the battery may be a self-limiting parameter. In other words, as the charging capacity of the battery is reduced, the rate of reduction in the charging capacity of the battery may be reduced. For example, the charging capacity of the battery may have reduced from 100 charging units to 95 charging units. In this case, the rate of reduction in the charging capacity of the battery may be high at the beginning. Then, as the charging capacity of the battery is continuously reduced, the rate of reduction in the charging capacity of the battery may be reduced. That is, the rate of reduction in the charging capacity of the battery when the charging capacity of the battery is reduced from 100 charging units to 99 charging units is higher than the rate of reduction in the charging capacity of the battery when the charging capacity of the battery is reduced from 99 charging units to 98 charging units.

The number of charging cycles that caused the charging capacity of the battery to be reduced from 100 charging units to 95 charging units may be 50. On the other hand, the number of charging cycles that caused the charging capacity of the battery to be reduced from 95 charging units to 90 charging units may be greater than 50. In other words, in 50 charging cycles, the charging capacity of the battery may not be reduced from 95 charging units to 90 charging units. As such, the rate of reduction in the charging capacity with respect to the number of charging cycles of the battery is reduced when the charging capacity of the battery is reduced to specific charging capacity.

A phenomenon in which the charging capacity of the battery is reduced as the number of charging cycles undergone by the battery is increased and thus the rate of reduction in the charging capacity of the battery is reduced is shown through regions indicating negative slopes in the graphs of FIGS. 3 and 4. As the rate of reduction in the charging capacity of the battery is reduced, values of the first derivative and second derivative with respect to the number of charging cycles of the charging capacity of the battery are reduced. This may be due to a decrease in the fitting parameter $\beta$ (see Equations 4 and 6). When the fitting parameter $\beta$ is less, the charging capacity of the battery is gradually reduced.

The gradual decrease of the rate of reduction in the charging capacity of the battery may increase a time during which the battery is maintained operable. This is shown through a region indicating a positive slope in the graph of FIG. 5. Referring to FIG. 5, the total usage life of the battery is reduced as the number of charging cycles undergone by the battery is increased. Accordingly, as shown in FIG. 5, the region indicating the positive slope, which denotes the 'increase' in the total usage life of the battery, denotes the decrease of the rate of reduction in the charging capacity of the battery or the reduction of the fitting parameter $\beta$ (see Equation 7).

When the charging capacity of the battery is reduced to a certain level or below, the charging capacity of the battery may start to be abruptly reduced as opposed to a gradual reduction occurring with respect to the charging capacity of the battery where the phenomenon in which the rate of reduction in the charging capacity of the battery is reduced as the charging capacity of the battery is reduced has occurred. The battery is no longer considered reliable when the charging capacity of the battery is abruptly reduced. A charging capacity level corresponds to the number of charging cycles undergone by the battery. Referring to FIG. 2, the charging capacity of the battery may start to be abruptly reduced when about 510 charging cycles are undergone by the battery. In this case, the battery is no longer expected to be reliable. The battery state measuring method and battery management system according to various embodiments of the disclosure may predict the abrupt reduction in the charging capacity of the battery sufficiently before the 510 charging cycles.

Considering the above example, when the charging capacity of the battery is reduced to 90 charging units, the rate of reduction in the charging capacity of the battery may exhibit an abrupt change. Several charging cycles may be undergone by the battery and accordingly, the charging capacity of the battery may be reduced to 90 charging units. When the charging capacity of the battery is reduced to less than 90 charging units, the charging capacity of the battery starts to be abruptly reduced, implying that an operation of the battery is no longer stable.

As shown in FIGS. 3 and 4, when about 400 charging cycles are undergone by the battery, the values of the first derivative and second derivative with respect to the number of charging cycles of the charging capacity of the battery may attain minimum values. This shows that when the number of charging cycles undergone by the battery exceeds 400, the charging capacity of the battery is abruptly reduced and thus the rate of reduction in the charging capacity of the battery is no longer gradual. As shown in FIGS. 3 and 4, when 400 charging cycles are undergone by the battery, a rate of change in the charging capacity of the battery (the first derivative) and a rate of change of the rate of change in the charging capacity of the battery (the second derivative) may attain minimum values ($10^{-4}$ and $10^{-8}$ respectively).

After the battery undergoes about 400 charging cycles, the abrupt reduction in the charging capacity of the battery may be imminent. As shown in FIGS. 3 and 4, the rate of change in the charging capacity of the battery (the first derivate) and the rate of change of the rate of change in the charging capacity of the battery (the second derivate) may begin to increase after about 400 charging cycles are undergone by the battery. The increase in values of the rate of change in the charging capacity of the battery (the first derivative) and the rate of change of the rate of change in the charging capacity of the battery (the second derivate) is shown in the regions having the positive slopes in the graphs of FIGS. 3 and 4. The value of fitting parameter β increases in the regions having the positive slopes in the graphs of FIGS. 3 and 4. When the fitting parameter β increases, the values of the first derivative and second derivative of the charging capacity of the battery are increased (see Equations 4 and 6).

As shown in FIG. 5, the total useful life of the battery may be at peak after the battery undergoes about 400 charging cycles. This is because the fitting parameter β is maintained low when the rate of reduction of the charging capacity of the battery is gradual. The total useful life of the battery is at the peak when the fitting parameter β is lowest (see Equation 7). The fitting parameter β may begin to increase after the battery undergoes about 400 charging cycles. This leads to a gradual decrease (shown through the region having the negative slope in the graph of FIG. 5) in the total useful life of the battery.

The battery state measuring method and battery management system according to various embodiments of the disclosure may detect a change pattern of a value of at least one precursor for predicting an abrupt reduction of the charging capacity of the battery. The change pattern of the value of the at least one precursor may be pre-configured for the first derivative and second derivative with respect to the number of charging cycles of the charging capacity of the battery and the total useful life of the battery. When the value of the at least one precursor is the first derivative and second derivative with respect to the number of charging cycles of the charging capacity of the battery, the pre-configured change pattern of the value of the at least one precursor may include a pattern in which the values of first derivative and second derivative decrease and then increase. On the other hand, when the value of the at least one precursor is the total useful life of the battery, the pre-configured change pattern of the value of the at least one precursor may include a pattern in which a value of the total useful life of the battery increases and then increases. The battery state measuring method and battery management system according to various embodiments of the disclosure may notify a user that the abrupt reduction in the charging capacity of the battery is imminent when the pre-configured pattern is detected.

Figure 6:
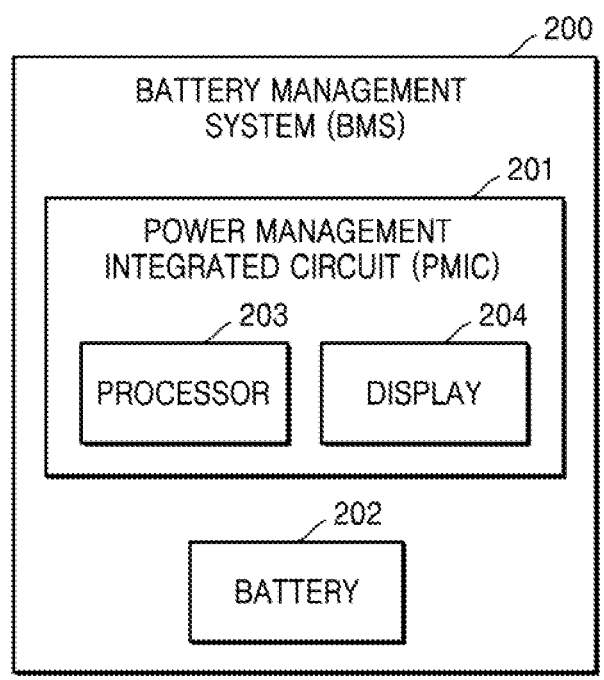
FIG. 6 is a block diagram of a configuration of a battery management system configured to predict an abrupt reduction in charging capacity of a battery, according to various embodiments of the disclosure.

FIG. 6 is a block diagram of a configuration of a battery management system (BMS) 200 configured to predict an abrupt reduction in charging capacity of a battery 202, according to various embodiments of the disclosure. The BMS 200 is not limited thereto and may include more or fewer number of components. Also, labels or names of components of the BMS 200 are used only for illustrative purposes and does not limit the scope of various embodiments of the disclosure. One or more components may be combined together to perform a same or similar function in the BMS 200.

According to an embodiment of the disclosure, the BMS 200 and the battery 202 may be included in an electric vehicle. According to another embodiment of the disclosure, the BMS 200 and the battery 202 may be included in any one of various devices. As shown in FIG. 2, the BMS 200 may include a power management integrated circuit (PMIC) 201. The PMIC 201 may include a processor 203 and a display 204.

Examples of the various devices to which the BMS 200 and the battery 202 are applicable include a smart phone, a laptop computer, a tablet computer, a wearable device, a camera, an Internet of things (IoT) device, a trimmer, a robot, a vacuum cleaner, and a vehicle infotainment system.

The processor 203 may determine charging capacity of the battery 202 at the end of a charging cycle undergone by the battery 202. The charging capacity of the battery 202 may be reduced at the end of each charging cycle. The processor 203 may determine that the charging capacity of the battery 202 is gradually reduced. The processor 203 may determine a reduction pattern of the charging capacity of the battery 202. According to an embodiment of the disclosure, the reduction pattern of the charging capacity of the battery 202 may follow a decaying exponential function.

According to an embodiment of the disclosure, a value of charging capacity of the battery 202 at the end of the charging cycle undergone by the battery 202 (when an i+$N^{th}$ charging cycle is undergone by the battery 202) is determined based on the decaying exponential function and the charging capacity of the battery 202 at the end of an $i^{th}$ charging cycle that is a reference. For example, a parameter of the decaying exponential function may be a product of a fitting parameter β and a number N (i.e., i+N−i) of charging cycles undergone by the battery 202, which exceeds a reference number i (see Equation 2).

One of natural phenomena of the battery 202 is a decrease of a rate of reduction in the charging capacity of the battery 202 according to reduction in the charging capacity of the battery 202. For example, the number of charging cycles required to reduce the charging capacity of the battery 202 by a same amount is increased as the charging capacity of the battery 202 is reduced.

The processor 203 may calculate at least one precursor to predict occurrence of an abrupt reduction in the charging capacity of the battery 202. The at least one precursor may include a first derivative and a second derivative with respect to a number of charging cycles of the charging capacity of the battery 202. Also, the at least one precursor may include a useful life of the battery 202 related to the number of charging cycles where the battery 202 is operable.

The processor 203 may determine a change pattern of the first derivative with respect to the number of charging cycles of the charging capacity of the battery 202 for the number N of charging cycles undergone by the battery 202 after the battery 202 undergoes the reference number i of charging cycles. Also, the processor 203 may determine a change pattern of the second derivative with respect to the number of charging cycles of the charging capacity of the battery 202 for the number N of charging cycles undergone by the battery 202 after the battery 202 undergoes the reference number i of charging cycles. In addition, the processor 203 may determine a change pattern of the useful life of the battery 202 related to the number of charging cycles where the battery 202 is maintained operable.

The processor 203 may determine that the values of first derivative and second derivative with respect to the number of charging cycles of the charging capacity of the battery 202 decrease with the increase in the number of charging cycles undergone by the battery 202. The rate of reduction in the charging capacity of the battery 202 is reduced as the number of charging cycles undergone by the battery 202 is increased. A value of the fitting parameter β may be maintained relatively low at a time when the values of first derivative and second derivative with respect to the number of charging cycles of the charging capacity of the battery 202 are gradually decreasing.

The decrease of the rate of reduction in the charging capacity of the battery 202 also increases a time period during which the battery 202 is operable. A pattern in which a time duration (the useful life of the battery 202) increases with the increase in the number of charging cycles undergone by the battery 202 follows reduction patterns of the values of first derivative and second derivative with respect to the number of charging cycles of the charging capacity of the battery 202. As long as the rate of reduction in the charging capacity of the battery 202 is reduced, the values of first derivative and second derivative with respect to the number of charging cycles of the charging capacity of the battery 202 follow the reduction patterns.

Another natural phenomenon occurring in the battery 202 is a phenomenon in which the charging capacity of the battery 202 starts to be abruptly reduced without being gradually reduced when the charging capacity of the battery 202 is below a certain level of charging capacity. When the charging capacity of the battery 202 starts to be abruptly reduced, the battery 202 is considered to be unreliable or inoperable. According to an embodiment of the disclosure, when the charging capacity of the battery 202 is reduced to less than 80% of initial charging capacity of the battery 202, it is highly likely that the battery 202 may be inoperable after a certain number of charging cycles. According to an embodiment of the disclosure, the charging capacity of the battery 202 may be reduced below 80% of the initial charging capacity of the battery 202 after the battery 202 undergoes about 510 charging cycles.

A charging capacity level at which the charging capacity of the battery 202 starts to be abruptly reduced may vary depending on a usage pattern of a device or vehicle where the battery 202 is mounted. Also, the number of charging cycles where the charging capacity of the battery 202 starts to be abruptly reduced and the battery 202 is highly likely to become inoperable may vary depending on the usage pattern of the device or vehicle where the battery 202 is mounted.

The values of first derivative and second derivative with respect to the number of charging cycles of the charging capacity of the battery 202 may be respectively reduced to minimum values after the battery 202 undergoes a critical number of charging cycles. For example, the values of first derivative and second derivative with respect to the number of charging cycles of the charging capacity of the battery 202 may be respectively reduced to the minimum values after the battery 202 undergoes 400 charging cycles. The total useful life of the battery 202 may reach a peak value when the values of first derivative and second derivative with respect to the number of charging cycles of the charging capacity of the battery 202 are respectively reduced to the minimum values. In this case, the critical number of charging cycles undergone by the battery 202 may be 400. Thereafter, when the battery 202 undergoes an additional number of charging cycles over 400, the values of first derivative and second derivative with respect to the number of charging cycles of the charging capacity of the battery 202 start to be increased (respectively from the minimum values) and the total useful life of the battery 202 starts to be reduced (from the peak value).

The processor 203 may be configured to monitor the change patterns of the value of total useful life and values of first derivative and second derivative with respect to the number of charging cycles of the charging capacity of the battery 202. The processor 203 may interpret that the abrupt reduction in the charging capacity of the battery 202 is imminent when it is determined that the value of total useful life and the values of first derivative and second derivative with respect to the number of charging cycles of the charging capacity of the battery 202 follow pre-configured patterns. The processor 203 may be pre-configured to detect the change patterns of the value of total useful life and the values of first derivative and second derivative with respect to the number of charging cycles of the charging capacity of the battery 202 to predict the abrupt reduction in the charging capacity of the battery 202.

When the processor 203 detects that the values of first derivative and second derivative with respect to the number of charging cycles of the charging capacity of the battery 202 follow a pattern of decreasing and then increasing, the processor 203 may determine that the battery 202 is likely to become unreliable and the abrupt reduction in the charging capacity of the battery 202 is imminent. Also, when the processor 203 detects that the value of total useful life of the battery 202 follows a pattern of increasing and then decreasing, the processor 203 may determine that the battery 202 is likely to become unreliable and the abrupt reduction in the charging capacity of the battery 202 is imminent.

When a change pattern of a value of at least one precursor is detected to follow at least one pre-configured pattern, the processor 203 may issue an alert indicating that the charging capacity of the battery 202 may start to be abruptly reduced. The alert of the processor 203 may be issued when it is detected that the total useful life, and the first derivative and second derivative with respect to the number of charging cycles of the charging capacity of the battery 202 follow pre-configured patterns. It may be detected that the total useful life, and the first derivative and second derivative with respect to the number of charging cycles of the charging capacity of the battery 202 follow the pre-configured patterns after the battery 202 undergoes the critical number of charging cycles. Accordingly, the processor 203 may issue the alert after the battery 202 undergoes the critical number of charging cycles.

According to an embodiment of the disclosure, the processor 203 may be configured to display a message on the display 204 according to the alert. The content of the message according to the alert may indicate that the battery 202 is no longer reliable and is likely to be inoperable in the future. According to another embodiment of the disclosure, a message suggesting, to a user, at least one corrective action for delaying initiation of the abrupt reduction in the charging capacity of the battery 202 may be displayed on the display 204, according to the alert issued by the processor 203. The corrective action may include content suggesting the user to change a usage pattern or charging pattern of the battery 202.

FIG. 7 is a flowchart 300 of a battery state measuring method of predicting the abrupt reduction in the charging capacity of the battery 202, according to various embodiments of the disclosure.

The battery state measuring method of predicting the abrupt reduction in the charging capacity of the battery 202, according to an embodiment of the disclosure, may include determining a change in the charging capacity of the battery 202 with respect to the number of charging cycles undergone by the battery 202 (operation 301). The charging capacity of the battery 202 may be reduced at the end of each charging cycle. The battery state measuring method of predicting the abrupt reduction in the charging capacity of the battery 202, according to various embodiments of the disclosure, may include determining the reduction pattern of the charging capacity of the battery 202. According to an embodiment of the disclosure, the reduction pattern of the charging capacity of the battery 202 follows a decaying exponential function. The battery state measuring method of predicting the abrupt reduction in the charging capacity of the battery 202, according to various embodiments of the disclosure, may include determining a charging capacity value of the battery 202 at the end of charging cycle, based on the decaying exponential function and charging capacity of the battery 202 at the end of reference number of charging cycles. Parameters of the decaying exponential function may include the fitting parameter β and the number N of charging cycles undergone by the battery 202, which exceeds the reference number of charging cycles undergone by the battery 202.

The battery state measuring method of predicting the abrupt reduction in the charging capacity of the battery 202, according to an embodiment of the disclosure, may include calculating at least one precursor for predicting occurrence of the abrupt reduction in the charging capacity of the battery 202 (operation 302). The at least one precursor includes the useful life of the battery 202 related to the number of charging cycles where the battery 202 may remain operable, and the first derivative and second derivative with respect to the number of charging cycles of the charging capacity of the battery 202 after the battery 202 undergoes the reference number of charging cycles.

The battery state measuring method of predicting the abrupt reduction of the charging capacity of the battery 202, according to various embodiments of the disclosure, may include determining change patterns of the useful life, and the first derivative and second derivative with respect to the number of charging cycles of the charging capacity of the battery 202, in relation to the number of charging cycles where the battery 202 may remain operable. The battery state measuring method of predicting the abrupt reduction of the charging capacity of the battery 202, according to various embodiments of the disclosure, may include determining the change patterns of the useful life, and the first derivative and second derivative of the charging capacity of the battery 202 with respect to the number of charging cycles undergone by the battery 202.

The battery state measuring method of predicting the abrupt reduction of the charging capacity of the battery 202, according to an embodiment of the disclosure, may include monitoring a change pattern of at least one precursor used to predict occurrence of the abrupt reduction of the charging capacity of the battery 202 (operation 303).

The battery state measuring method of predicting the abrupt reduction of the charging capacity of the battery 202, according to various embodiments of the disclosure, may include monitoring change patterns of values of the total useful life, and the first derivative and second derivative with respect to the number of charging cycles of the charging capacity of the battery 202. The battery state measuring method of predicting the abrupt reduction of the charging capacity of the battery 202, according to various embodiments of the disclosure, may include determining reduction in the values of the first derivative and second derivative with respect to the number of charging cycles of the charging capacity of the battery 202 with the increase in the number of charging cycles undergone by the battery 202. The rate of reduction in the charging capacity of the battery 202 is reduced as the number of charging cycles undergone by the battery 202 is increased.

The battery state measuring method of predicting the abrupt reduction in the charging capacity of the battery 202, according to various embodiments of the disclosure, may include determining that the total useful life of the battery 202 is increasing with the reduction of the rate of reduction in the charging capacity of the battery 202. The battery state measuring method of predicting the abrupt reduction in the charging capacity of the battery 202, according to various embodiments of the disclosure, may include determining that the values of first derivative and second derivative with respect to the number of charging cycles of the charging capacity of the battery 202 follow a reduction pattern and the value of total useful lifetime of the battery 202 follows an increase pattern while the rate of reduction in the charging capacity of the battery 202 is gradually reduced.

The battery state measuring method of predicting the abrupt reduction of the charging capacity of the battery 202, according to various embodiments of the disclosure, may include detecting that the values of first derivative and second derivative with respect to the number of charging cycles of the charging capacity of the battery 202 are respectively reduced to minimum values as the charging capacity of the battery 202 is gradually reduced. The battery state measuring method of predicting the abrupt reduction of the charging capacity of the battery 202, according to various embodiments of the disclosure, may include determining the charging capacity of the battery 202 and the number of charging cycles undergone by the battery 202 when the values of first derivative and second derivative with respect to the number of charging cycles of the charging capacity of the battery 202 are respectively reduced to the minimum values. The battery state measuring method of predicting the abrupt reduction of the charging capacity of the battery 202, according to various embodiments of the disclosure, may include detecting that the total useful life of the battery 202 is increased to a peak value when the values of first derivative and second derivative with respect to the number of charging cycles of the charging capacity of the battery 202 are respectively reduced to the minimum values.

The battery state measuring method of predicting the abrupt reduction of the charging capacity of the battery 202, according to various embodiments of the disclosure, may include storing the charging capacity of the battery 202 and the number of charging cycles undergone by the battery 202 when the values of first derivative and second derivative with respect to the number of charging cycles of the charging capacity of the battery 202 are respectively reduced to the minimum values and the value of total useful life of the battery 202 is increased to the peak value. The charging capacity of the battery 202 and the number of charging cycles undergone by the battery 202 when the values of first derivative and second derivative with respect to the number of charging cycles of the charging capacity of the battery 202 are respectively reduced to the minimum values and the value of total useful life of the battery 202 is increased to the peak value may be respectively referred to as 'critical capacity' and 'critical number'. The battery state measuring method of predicting the abrupt reduction in the charging capacity of the battery 202, according to various embodiments of the disclosure, may include determining that the total useful life of the battery 202 starts to be reduced and the values of first derivative and second derivative with respect to the number of charging cycles of the charging capacity of the battery 202 start to be increased when an additional number of charging cycles exceeding the critical number is undergone by the battery 202.

The battery state measuring method of predicting the abrupt reduction in the charging capacity of the battery 202, according to an embodiment of the disclosure, may include predicting that the abrupt reduction in the charging capacity of the battery 202 is imminent when the change pattern of the at least one precursor follows at least one pre-configured pattern (operation 304). The battery state measuring method of predicting the abrupt reduction in the charging capacity of the battery 202, according to various embodiments of the disclosure, may include configuring a pre-configured pattern for each precursor. The battery state measuring method of predicting the abrupt reduction of the charging capacity of the battery 202, according to various embodiments of the disclosure, may include detecting whether at least one value from among the total useful life, and the first derivative and second derivative with respect to the number of charging cycles of the charging capacity of the battery 202 follows the at least one pre-configured pattern.

The battery state measuring method of predicting the abrupt reduction in the charging capacity of the battery 202, according to various embodiments of the disclosure, may include determining that the battery 202 is likely to become unreliable and the abrupt reduction in the charging capacity of the battery 202 is imminent when it is detected that the values of first derivative and second derivative with respect to the number of charging cycles of charging capacity of the battery 202 follow a pattern of decreasing and the increasing. Also, the battery state measuring method of predicting the abrupt reduction in the charging capacity of the battery 202, according to various embodiments of the disclosure, may include determining that the battery 202 is likely to become unreliable and the abrupt reduction in the charging capacity of the battery 202 is imminent when it is detected that the value of total useful life of the battery 202 follows a pattern of increasing and then decreasing.

The battery state measuring method of predicting the abrupt reduction in the charging capacity of the battery 202, according to an embodiment of the disclosure, may include issuing an alert indicating a possibility of initiation of the abrupt reduction in the charging capacity of the battery 202 when it is detected that the change pattern of the value of at least one precursor follows the at least one pre-configured pattern (operation 305). The battery state measuring method of predicting the abrupt reduction of the charging capacity of the battery 202, according to various embodiments of the disclosure, may include issuing the alert when the value of the total useful life of the battery 202 is increased to the peak value and the values of first derivative and second derivative with respect to the number of charging cycles of the charging capacity of the battery 202 are respectively reduced to the minimum values. This is because, after the battery 202 undergoes the critical number of charging cycles, the change patterns of the values of first derivative and second derivative with respect to the number of charging cycles of the charging capacity of the battery 202 follow the pre-configured pattern of decreasing and then increasing, and the change pattern of the value of total useful life of the battery 202 follows the pre-configured pattern of increasing and then decreasing.

According to an embodiment of the disclosure, a message indicating that the battery 202 is unreliable may be displayed according to the alert. According to an embodiment of the disclosure, a message suggesting at least one corrective action delaying the initiation of the abrupt reduction in the charging capacity of the battery 202 may be displayed. For example, when the battery 202 is applied to a device, the battery state measuring method of predicting the abrupt reduction in the charging capacity of the battery 202, according to various embodiments of the disclosure, may include suggesting to first replace the battery 202 from among various components included in the device. Also, the battery state measuring method of predicting the abrupt reduction in the charging capacity of the battery 202, according to various embodiments of the disclosure, may use, as the corrective action, a conservative charging protocol of preventing fast charging of the device (when the device supports the fast charging) and preventing deterioration of the battery 202 by pumping a low current to the battery 202. Also, the battery state measuring method of predicting the abrupt reduction of the charging capacity of the battery 202, according to various embodiments of the disclosure, may prevent an operation of an application that is likely to consume the battery 202 fast, and prevent a specific operation, such as Bluetooth, near field communication (NFC), or a flashlight.

When the battery 202 is applied to a vehicle, the battery state measuring method of predicting the abrupt reduction in the charging capacity of the battery 202, according to various embodiments of the disclosure, may suggest vehicle maintenance. The battery state measuring method of predicting the abrupt reduction in the charging capacity of the battery 202, according to various embodiments of the disclosure, may warn that estimation of a range of movable distance of the vehicle (a range of movable distance of the vehicle based on a current charging state) is unreliable. The battery state measuring method of predicting the abrupt reduction in the charging capacity of the battery 202, according to various embodiments of the disclosure, may suggest to redistribute load without using a defective battery pack.

Various operations of the flowchart 300 of FIG. 7 may be performed in a presented order or in a different order. Alternatively, some of the operations of the flowchart 300 may be simultaneously performed. Also, according to some embodiments of the disclosure, some operations of the flowchart 300 may be omitted.

Various embodiments of the disclosure may be implemented through at least one software program running on at least one hardware device and performing a network management function for controlling a network element. The network element shown in FIG. 6 includes a block that may be at least one of a hardware device or a combination of a hardware device and a software module.

Various embodiments of the disclosure include the battery state measuring method and battery management system, which predict a time point when charging capacity of a battery is abruptly reduced in a device/vehicle where the battery is mounted, sufficiently before the battery becomes inoperable. Thus, the scope of protection of various embodiments of the disclosure may be extended to a computer-readable storage medium including a message therein and such a program. The computer-readable storage medium may implement one or more operations of the battery state measuring method according to various embodiments of the disclosure and may include a computer program executed by a server, a mobile device, or an appropriate programming device. The battery state measuring method according to various embodiments of the disclosure may be implemented through or together with a software program written in example Very high speed integrated circuit Hardware Description Language (VHDL), or any other programming language, or implemented by one or more VHDL or several software modules being executed on at least one hardware device. The hardware device may be any type of portable device capable of being programmed.

For example, a device may include hardware (for example, an application-specific integrated circuit (ASIC)) or a combination of hardware and software (for example, an ASIC and a field programmable gate array (FPGA), or at least one microprocessor and at least one memory including a software module).

The battery state measuring method of predicting the abrupt reduction in the charging capacity of the battery, according to various embodiments of the disclosure, may be implemented partially in hardware and partially in software. Alternatively, the battery state measuring method of predicting the abrupt reduction in the charging capacity of the battery, according to various embodiments of the disclosure, may be implemented on, for example, various hardware devices (for example, a plurality of central processing units (CPUs)).

Provided are a battery state measuring method and battery management system for predicting occurrence of an abrupt reduction in charging capacity of a battery provided in a device/vehicle sufficiently before a time point when the battery may become inoperable.

The battery state measuring method and battery management system according to various embodiments of the disclosure may predict the occurrence of the abrupt reduction in the charging capacity of the battery, based on real-time monitoring on change patterns of precursors, such as a useful life of the battery and a first derivative and second derivative of the charging capacity of the battery.

Also, the battery state measuring method and battery management system according to various embodiments of the disclosure may provide a user with a sufficient time to take a corrective action before a sudden death phenomenon of the battery occurs by issuing an alert indicating the abrupt reduction of the charging capacity of the battery.

Hereinabove, the battery state measuring method and battery management system are described with reference to the embodiments of the disclosure shown in the drawings for better understanding, but the embodiments of the disclosure are only examples and it would be understood by one of ordinary skill in the art that various modifications and equivalents are derivable therefrom. Accordingly, the true technical scope of protection of the battery state measuring method and battery management system according to the disclosure should be defined by the appended claims.

What is claimed is:

1. A battery state measuring method that is performed by at least one processor to predict a time point when charging capacity of a battery is to be relatively abruptly reduced, the battery state measuring method comprising:
   while the battery is being operated, monitoring a change pattern of a first derivative or a second derivative of the charging capacity of the battery in real time with respect to a number of charging cycles of the battery; and
   predicting that an abrupt reduction in the charging capacity of the battery is imminent based on the change pattern of the first derivative or the second derivative of the charging capacity of the battery,
   wherein the charging capacity of the battery is defined as $C_{i+N}=C_i\exp(-\beta N)$, wherein Ci is the charging capacity of the battery immediately after an ith charging cycle, and Ci+N is the charging capacity of the battery immediately after an i+N$^{th}$ charging cycle and
   wherein N is the number of charging cycles of the battery, and $\beta$ is a fitting parameter defining a rate of reduction in the charging capacity of the battery.

2. The battery state measuring method of claim 1, wherein the at least one pre-configured pattern followed by the change pattern of at least one of the first derivative or the second derivative includes a pattern that decreases and then increases.

3. The battery state measuring method of claim 1, further comprising issuing at least one alert indicating that the abrupt reduction in the charging capacity of the battery is imminent.

4. The battery state measuring method of claim 3, wherein the issuing of the at least one alert comprises at least one of displaying a warning message indicating that the battery is unreliable or suggesting at least one corrective action for delaying initiation of the abrupt reduction in the charging capacity of the battery.

5. A battery state measuring method that is performed by at least one processor to predict a time point when charging capacity of a battery is to be relatively abruptly reduced, the battery state measuring method comprising:
   estimating the charging capacity of the battery by monitoring charging and discharging data of the battery;
   calculating a first derivative of the estimated charging capacity of the battery;
   calculating a second derivative of the estimated charging capacity of the battery;
   while the battery is being operated, monitoring a change pattern of the first derivative and the second derivative of the charging capacity of the battery; and
   generating a decision indicative of abrupt reduction in the charging capacity of the battery, based on the change pattern of the first derivative and the second derivative of the charging capacity of the battery,
   wherein the charging capacity of the battery is defined as $C_{i+N}=C_i\exp(-\beta N)$, wherein Ci is the charging capacity of the battery immediately after an ith charging cycle, and Ci+N is the charging capacity of the battery immediately after an i+N$^{th}$ charging cycle and
   wherein N is a number of charging cycles of the battery, and $\beta$ is a fitting parameter defining a rate of reduction in the charging capacity of the battery.

6. A battery management system for predicting a time point when charging capacity of at least one battery is to be relatively abruptly reduced, the battery management system comprising:
   the at least one battery; and
   a processor configured to measure a state of the battery, wherein the processor is further configured to:
   while the at least one battery is being operated, monitor a change pattern of a first derivative or a second derivative of the charging capacity of the at least one battery in real time with respect to a number of charging cycles of the at least one battery; and
   predict that an abrupt reduction in the charging capacity of the at least one battery is imminent based on the change pattern of the first derivative or the second derivative of the charging capacity of the at least one battery,
   wherein the charging capacity of the at least one battery is defined as $C_{i+N}=C_i\exp(-\beta N)$, wherein Ci is the charging capacity of the battery immediately after an ith charging cycle, and Ci+N is the charging capacity of the battery immediately after an i+N$^{th}$ charging cycle and
   wherein N is the number of charging cycles of the at least one battery and $\beta$ is a fitting parameter defining a rate of reduction in the charging capacity of the at least one battery.

7. The battery management system of claim 6, wherein the at least one pre-configured pattern followed by the change pattern of at least one of the first derivative or the second derivative includes a pattern that decreases and then increases.

8. The battery management system of claim 6, wherein the processor is further configured to issue at least one alert indicating that the abrupt reduction in the charging capacity of the at least one battery is imminent.

9. The battery management system of claim 8, further comprising a display displaying a message according to at least one warning signal generated by the processor, wherein the message comprises at least one of a warning message indicating that the battery is unreliable or a message suggesting at least one corrective action for delaying initiation of the abrupt reduction in the charging capacity of the at least one battery.

* * * * *